(12) United States Patent
Michaelis

(10) Patent No.: US 8,054,049 B1
(45) Date of Patent: Nov. 8, 2011

(54) USING BATTERY ORIENTATION TO CONTROL MODE OF OPERATION

(75) Inventor: Paul Roller Michaelis, Louisville, CO (US)

(73) Assignee: Avaya Inc., Basking Ridge, NJ (US)

( * ) Notice: Subject to any disclaimer, the term of this patent is extended or adjusted under 35 U.S.C. 154(b) by 288 days.

(21) Appl. No.: 11/847,924

(22) Filed: Aug. 30, 2007

(51) Int. Cl.
*H02J 7/04* (2006.01)

(52) U.S. Cl. ........................................................ 320/165

(58) Field of Classification Search .................. 320/165; 307/127, 138; 361/246
See application file for complete search history.

(56) References Cited

U.S. PATENT DOCUMENTS

| | | | | |
|---|---|---|---|---|
| 2,869,717 A * | 1/1959 | Corrado et al. | ............ | 199/18 |
| 3,434,034 A * | 3/1969 | Garber et al. | ............ | 363/127 |
| 3,700,999 A * | 10/1972 | Gourse | ............ | 320/100 |
| 3,819,951 A * | 6/1974 | Moore | ............ | 361/77 |
| 3,860,868 A * | 1/1975 | Lindell et al. | ............ | 324/133 |
| 4,027,223 A * | 5/1977 | Renz | ............ | 320/165 |
| 4,139,880 A * | 2/1979 | Ulmer et al. | ............ | 361/246 |
| 4,420,786 A * | 12/1983 | Toney | ............ | 361/77 |
| 4,423,456 A * | 12/1983 | Zaidenweber | ............ | 361/77 |
| 4,473,757 A * | 9/1984 | Farago et al. | ............ | 307/127 |
| 5,161,879 A * | 11/1992 | McDermott | ............ | 362/206 |
| 5,343,135 A * | 8/1994 | Mathieson | ............ | 320/165 |
| 5,343,138 A * | 8/1994 | Ainsworth | ............ | 320/132 |
| 5,623,550 A * | 4/1997 | Killion | ............ | 381/322 |
| 6,023,418 A * | 2/2000 | Engira | ............ | 363/63 |
| 2005/0269480 A1* | 12/2005 | Ford et al. | ............ | 250/200 |
| 2006/0146724 A1* | 7/2006 | Ahya et al. | ............ | 370/252 |
| 2006/0173651 A1* | 8/2006 | Ferrari et al. | ............ | 702/168 |

FOREIGN PATENT DOCUMENTS

JP       2000138982 A   *   5/2000

\* cited by examiner

*Primary Examiner* — Patrick Assouad
*Assistant Examiner* — Manuel Hernandez
(74) *Attorney, Agent, or Firm* — Sheridan Ross P.C.

(57) ABSTRACT

Electrical contacts in the battery compartment of a device will permit a battery to be inserted with the "+" pole of the battery against either one of the two contacts, with the "−" pole of the battery positioned against the other contact. A polarity-sensing circuit detects the battery's orientation. If a first orientation is detected, i.e., the "+" pole of the battery is touching Contact "A" and the "−" pole of the battery is touching Contact "B", the polarity-sensing circuit mode-of-operation 1 will be selected. If the second orientation is detected, i.e., the "+" pole of the battery is touching Contact "B" and the "−" pole of the battery is touching Contact "A", mode-of-operation 2 will be selected. A bridge rectifier, downstream from the polarity sensor, can ensure that the other circuits in the device receive power that is polarized correctly regardless of battery orientation.

20 Claims, 5 Drawing Sheets

USING BATTERY ORIENTATION TO CONTROL MODE OF OPERATION

FIELD OF THE INVENTION

An exemplary embodiment of the present invention is directed toward battery-powered devices, and more specifically for controlling the operating mode of a battery-powered device.

BACKGROUND

Battery polarity identification circuits are well known. For example, U.S. Pat. No. 5,838,143 is directed toward an automatic battery polarity identification circuit having a first electroplate and a second electroplate adapted for receiving two opposite ends of a battery. The circuit further comprises a capacitor having a first end and a second end, and at least one relay, each of the at least one relay having a coil, the coil having a first end connected to the first end of the capacitor and a second end, a second fixed contact and a third fixed contact connected between the first electroplate and the second end of the coil, the first fixed contact and a fourth fixed contact connected to the second electrode.

SUMMARY

An exemplary embodiment of the present invention is generally directed toward reconfiguration of a device, such as a battery-powered device, based on the manner in which a battery(s) is installed.

In one exemplary embodiment, the electrical contacts in the battery compartment of the device will permit the battery to be inserted with the "+" pole of the battery against either one of the two contacts, with the "−" pole of the battery positioned against the other contact. A polarity-sensing circuit detects the battery's orientation. If a first orientation is detected, i.e., where the "+" pole of the battery is touching Contact A and "−" pole of the battery is touching Contact B, the polarity-sensing circuit mode-of-operation 1 will be selected. If the second orientation is detected, i.e., the "+" pole of the battery is touching Contact B and the "−" pole of the battery is touching Contact A, polarity-sensing circuit mode-of-operation 2 will be selected. A bridge rectifier, downstream from the polarity sensor, can ensure that the other circuits in the device continue to receive power that is polarized correctly regardless of battery orientation.

In accordance with an exemplary embodiment, the polarity detection mechanism and bridge rectifier can be implemented with no moving parts, rather than an electro-mechanical switch as the user interface for selecting between available modes-of-operation.

Different constructs of the device allow different types of polarity detectors to be used, along with different configurations of polarity detectors with, for example, the ability to activate a low battery indicator upon the inability to, for example, detect current.

Still further exemplary embodiments of the invention relate to the ability to switch a device, illustratively a telephone handset between a first mode of operation (e.g., a "press to amplify" mode) and a second mode of operation (e.g., a "press to talk" mode) based on battery orientation.

Exemplary embodiments of the invention also relate to the ability to switch a device, such as a toy, or in general any device, between a first mode of operation and a second mode of operation based on battery orientation.

Additional aspects of the invention relate to the ability to control the mode of operation of a portion of a device based on the polarity sensing circuit(s) while not affecting the mode of operation of another portion of the device.

These and other features and advantages of this invention are described in, or are apparent from, the following detailed description of the exemplary embodiments. The embodiments and configurations herein are neither complete nor exhaustive. As will be appreciated, other embodiments of the invention are possible utilizing, alone or in combination, one or more of the features set forth above or described in detail below.

BRIEF DESCRIPTION OF THE DRAWINGS

Exemplary embodiments of the invention will be described in detail, with reference to the following figures wherein.

DETAILED DESCRIPTION

The exemplary embodiments of this invention will be described in relation to a battery orientation operational control circuit and associated components. However, it should be appreciated that in general, the systems and methods of this invention work well in a plurality of environments, including AC, DC, and can be extended to include one or more batteries. In multi-battery configurations, the batteries themselves may be in series, in parallel, or a combination of the two.

Exemplary systems and methods of this invention will also be described in relation to basic power supply type circuitry and associated hardware. However, to avoid unnecessarily obscuring the present invention, the following description omits well-known structures, components and devices that may be shown in block diagram form, are well known or are otherwise summarized.

For purposes of explanation, numerous details are set forth in order to provide a thorough understanding of the present invention. It should be appreciated however that the present invention may be practiced in a variety of ways beyond the specific details set forth herein.

The term module as used herein can refer to any known or later developed hardware, software, firmware, or combination thereof that is capable of performing the functionality associated with that element. The terms determine, calculate and compute, and variations thereof, as used herein are used interchangeably and include any type of methodology, process, mathematical operation or technique. Further, it is to be noted that the term "a" or "an" entity refers to one or more of that entity. As such, the terms "a" (or "an"), "one or more" and "at least one" can be used interchangeably herein. It is also to be noted that the terms "comprising", "including" and "having" can be used interchangeably. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

Figure 1:
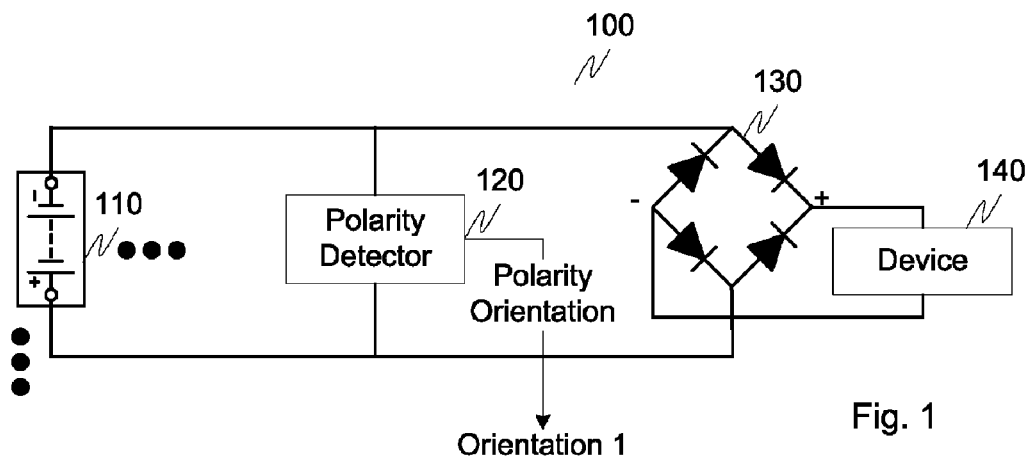
FIG. 1 illustrates an exemplary embodiment of a battery orientation operational control circuit according to this invention.
Figure 2:
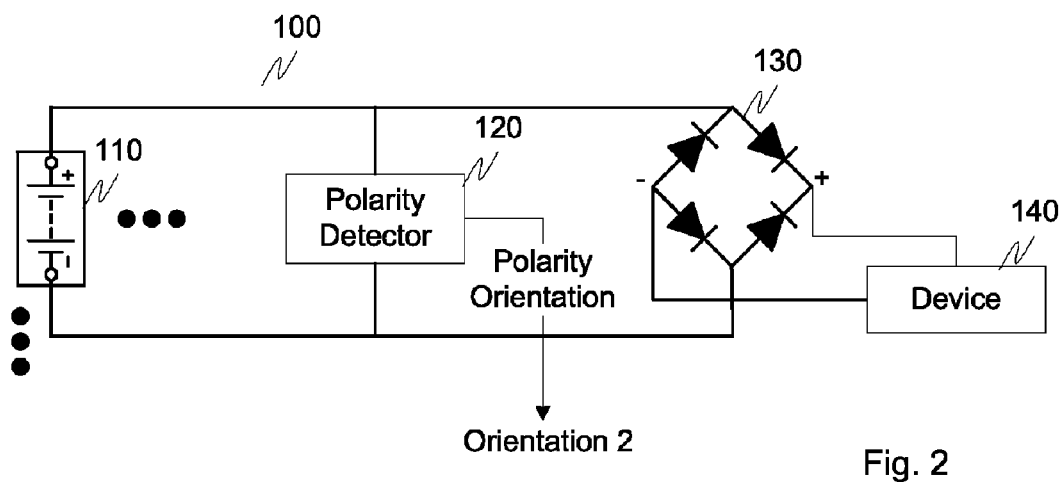
FIG. 2 illustrates an alternative configuration of the battery orientation operational control circuit of FIG. 1.

FIGS. 1 and 2 illustrate an exemplary embodiment of a battery orientation operational control circuit 100 according to this invention. The battery orientation operational control circuit 100 comprises a battery 110, a polarity detector 120, a bridge rectifier 130 and a device 140. As illustrated in FIG. 1, the battery 100 is oriented in a first direction. In this first orientation, the polarity detector 120 detects the battery orientation and, with the cooperation of the polarity detector 120, outputs a polarity detection signal. In this particular embodiment, with the battery in this first orientation, the polarity detection circuit 120 outputs a polarity detection signal indicating the battery is in "Orientation 1." This polarity detection signal can be used to control the operational mode of the device 140 based on the battery's orientation.

As illustrated in FIG. 2, the battery 110 is in a second orientation. Similar to the operation of FIG. 1, the polarity detector 120 detects the orientation of the battery 110 and outputs a polarity detection signal, which in this case indicates the operational mode should be in accordance with "Orientation 2" based on the change in polarity of the battery 110.

Figure 3:
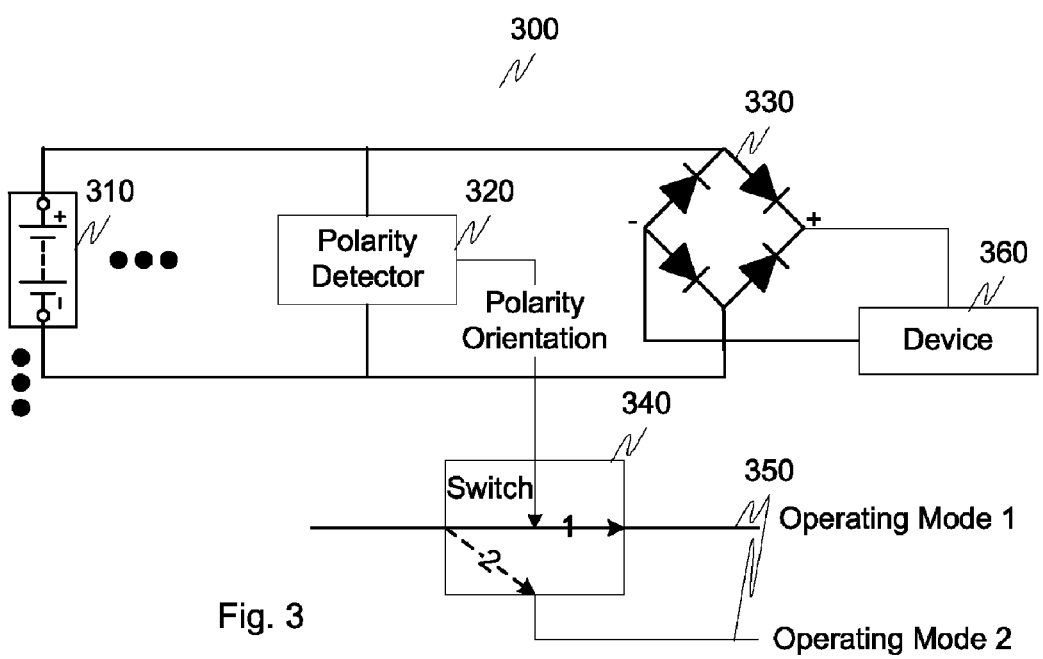
FIG. 3 illustrates a second exemplary embodiment of a battery orientation operational control circuit according to this invention.

FIG. 3 illustrates another alternative embodiment of a battery orientation operational control circuit 300. The battery orientation operational control circuit 300 comprises a battery 310, a polarity detector 320, a bridge rectifier 330, a switch 340, polarity detection signals 350 and device 360.

In this exemplary embodiment, the battery 310 is oriented in a first position, which corresponds to Operating Mode 1. More specifically, the polarity detector 320 detects the battery orientation and outputs a polarity detection signal which is forwarded to switch 340. The polarity detection signal controls the switch 340 to select between Operating Mode 1 and Operating Mode 2. Thus, since the battery 310 is in a first orientation, the polarity detection signal switches the switch 340 to position "1" which subsequently outputs or selects Operating Mode 1 of, for example, device 360. It should be appreciated however, that while the selection of operational mode is discussed in relation to, for example, device 360, the operating mode control signal can be used to control any one or more devices (not shown) and is not limited to device 360.

Figure 4:
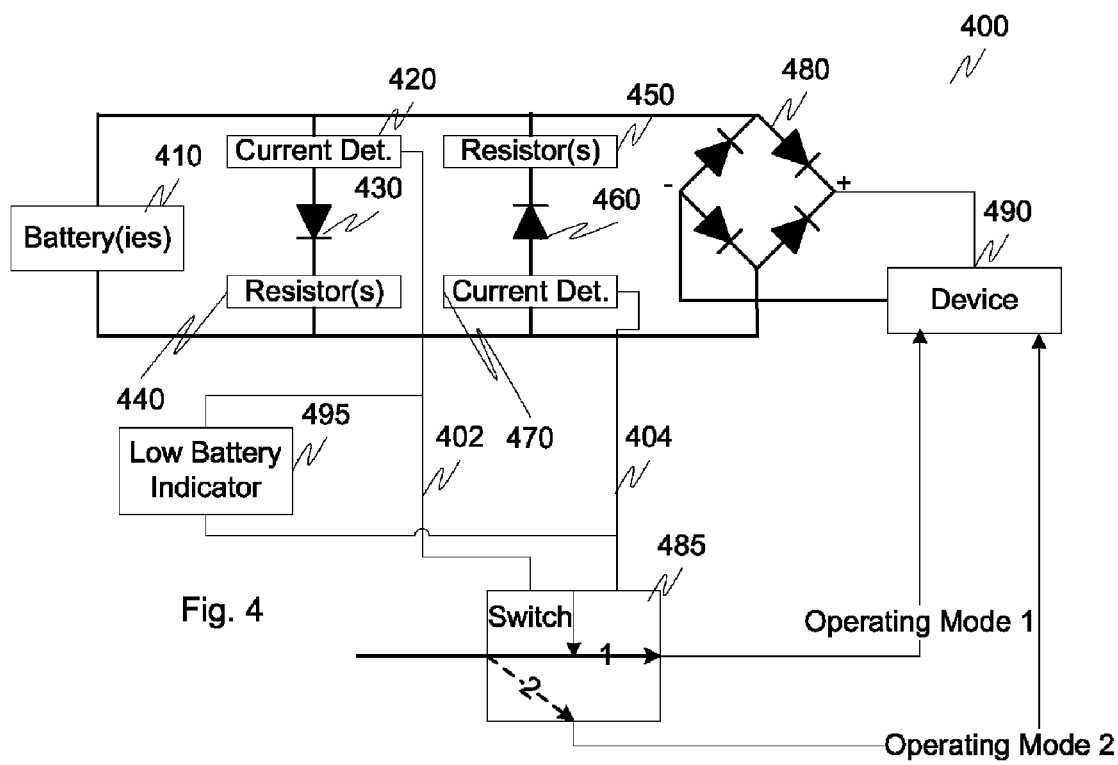
FIG. 4 illustrates a third exemplary embodiment of a battery orientation operational control circuit according to this invention.

FIG. 4 illustrates another exemplary embodiment of a battery orientation operational control circuit 400. The battery orientation operational control circuit 400 comprises a battery 410, a first polarity detection circuit including current detector 420, diode 430 and resistor 440, a second polarity detection circuit including resistor 450, diode 460 and current detector 470, bridge rectifier 480, switch 485 and device 490. The battery orientation operational control circuit 400 can also optionally include a low battery indicator module 495.

In operation, current is detected at one of the current detectors 420 and 470. Depending on where current is detected, one of the current detectors 420 and 470 outputs a polarity detection signal, 402 and 404, respectively. If current is detected at current detector 420, the current detector 420 outputs the polarity detection signal 402 to switch 485. The polarity detection signal 402 enables the switch 485 to select Operating Mode 1 which corresponds to a first operational mode of device 490.

If current is detected at the second current detector 470, the polarity detection signal 404 is output to switch 485. In this case, polarity detection signal 404 switches switch 485 to select Operating Mode 2 which corresponds to a second operational mode of device 490.

The battery orientation operational control circuit 400 can also include a low battery indicator module 495. The low battery indicator module 495 can be connected to outputs of the current detectors 420 and 47. In the event that neither current detector is producing an output, the low battery indicator module 495 can provide an indication that the battery 410 is low on power.

Figure 5:
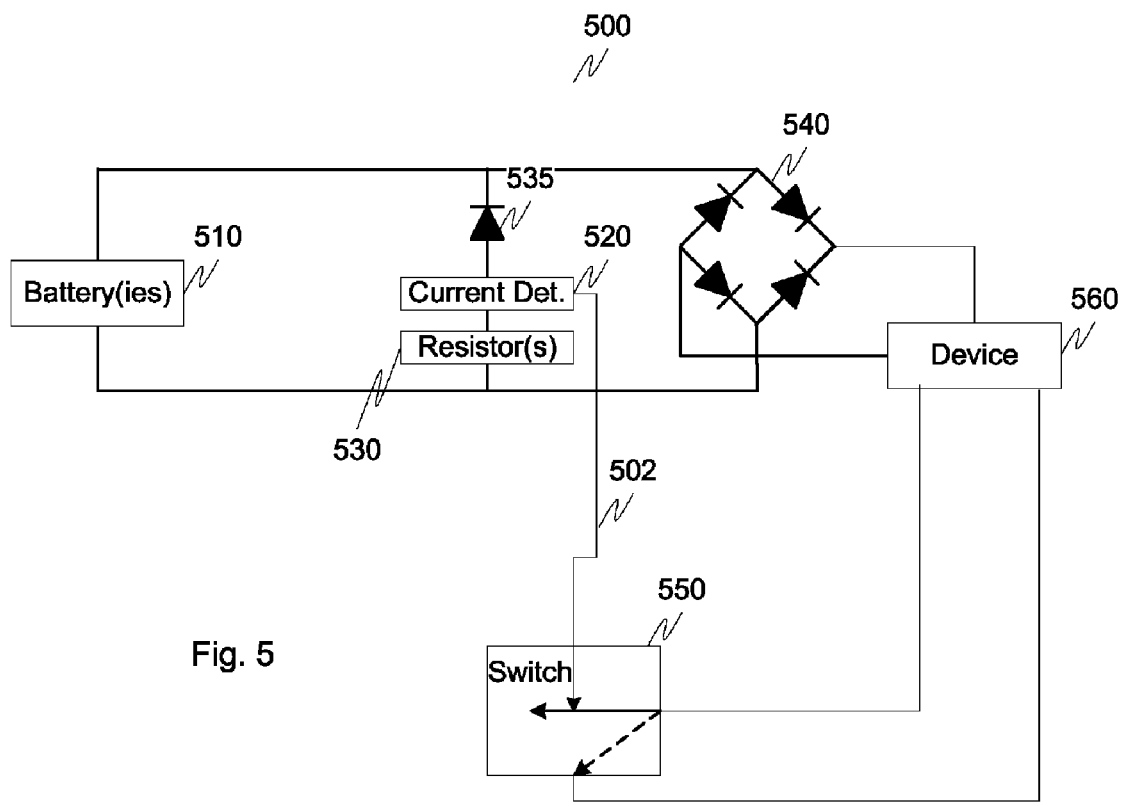
FIG. 5 illustrates a fourth exemplary embodiment of a battery orientation operational control circuit according to this invention.

FIG. 5 illustrates an alternative exemplary embodiment of a battery orientation operational control circuit 500. The battery orientation operational control circuit 500 comprises a battery 510, a current detector 520, one or more resistors 530 (which, similar to the other embodiments, can optionally be placed on one or more sides of the diode), diode 535, bridge rectifier 540, switch 550 and device 560. In operation, a determination is made whether current is detected at the current detector 520. In this particular configuration, with the battery 510 oriented in a first direction, current will not be detected at current detector 520. However, when the battery orientation is switched, current will be detected at current detector 520 and a corresponding polarity detection signal 502 output to switch 550. The polarity detection signal 502 controls the switch such that if current is detected, switch 550 is in an open position (which may correspond to Operating Mode 1) and if no current is detected, switch 550 switches to a closed position, which for example, corresponds to Operating Mode 2 of device 560.

Figure 6:
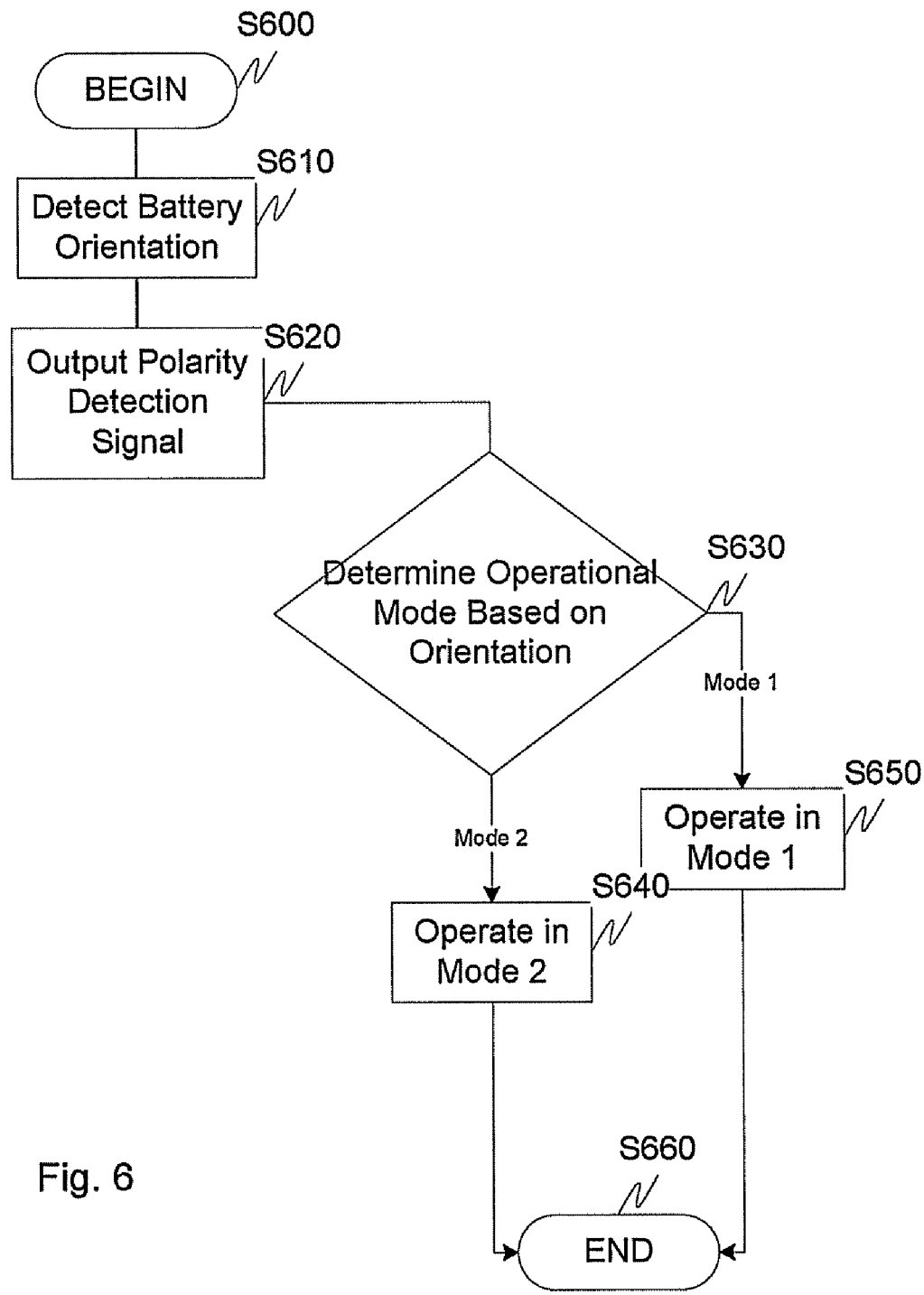
FIG. 6 is a flowchart outlining an exemplary method for operating a battery orientation operational control circuit according to this invention.

FIG. 6 illustrates an exemplary mode of operation of a battery operational control circuit. In particular, control begins in step S600 and continues to step S610. In step S610, battery orientation is detected. Next, in step S620, a polarity detection signal is output. Then, in step S630, a determination is made which operational mode the battery orientation operational control circuit should operate in. If a first polarity detection signal is detected, battery orientation operational control circuit operates in mode 1 (step S650) with control continuing step S660 where the control sequence ends.

If a second polarity detection signal is detected, the battery orientation operational control circuit operates in mode 2 (step S640) with control continuing to step S660 where the control sequence ends.

Figure 7:
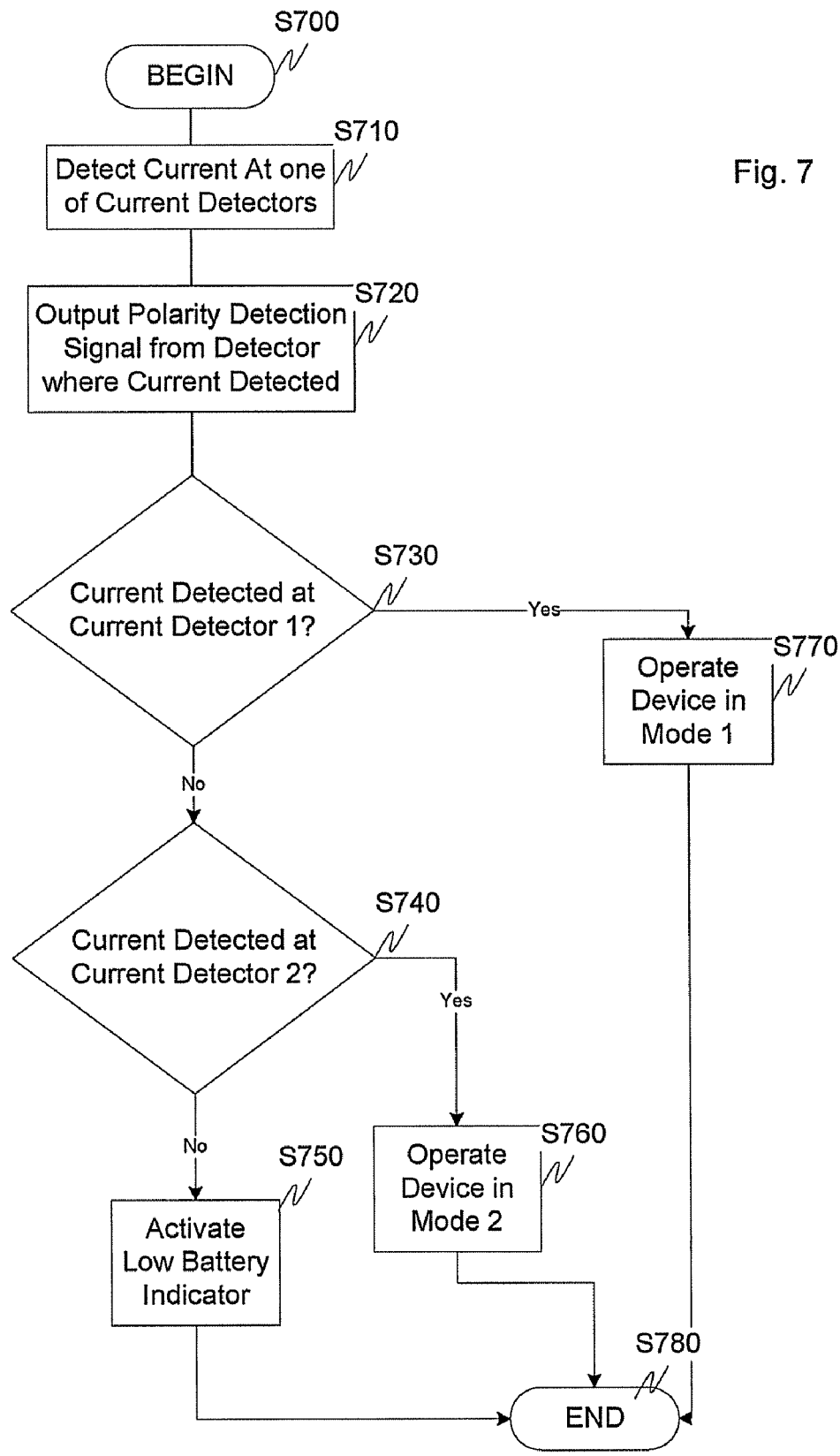
FIG. 7 is a flowchart illustrating an alternative exemplary embodiment for operating a battery orientation operational control circuit according to this invention.

FIG. 7 outlines a second exemplary method of operation of a battery orientation operational control circuit. In particular, control begins at step S700 and continues to step S710.

In step S710, current at one of a plurality of current detectors is detected. Next, in step S720, a polarity detection signal is output from the current detector where the current is detected.

In step S730, a determination is made whether current has been detected at a first current detector. If current has been detected, control continues to step S770 where the control signal places the device into a first mode of operation. However, if no current is detected, control continues to step S740 where a determination is made whether current is detected at the second current detector. If current is detected at the second current detector, control continues to step S760 where the control signal places the device in a second mode of operation, with control continuing to step S780.

If current is not detected at the second detector, optional step 750 can activate a low battery indicator with control continuing to step S780 where the control sequence ends.

As will be appreciated by one of ordinary skill in the art, the detection of current in many devices is not a simple yes/no test of whether an electrical current is present, but is instead a determination of whether the current in the circuit exceeds a threshold value. For this reason, the detection of current, as described in this application, is intended to include cases in which there is no current as well as cases in which the current must exceed a non-zero value in order to be regarded as detected.

Figure 8:
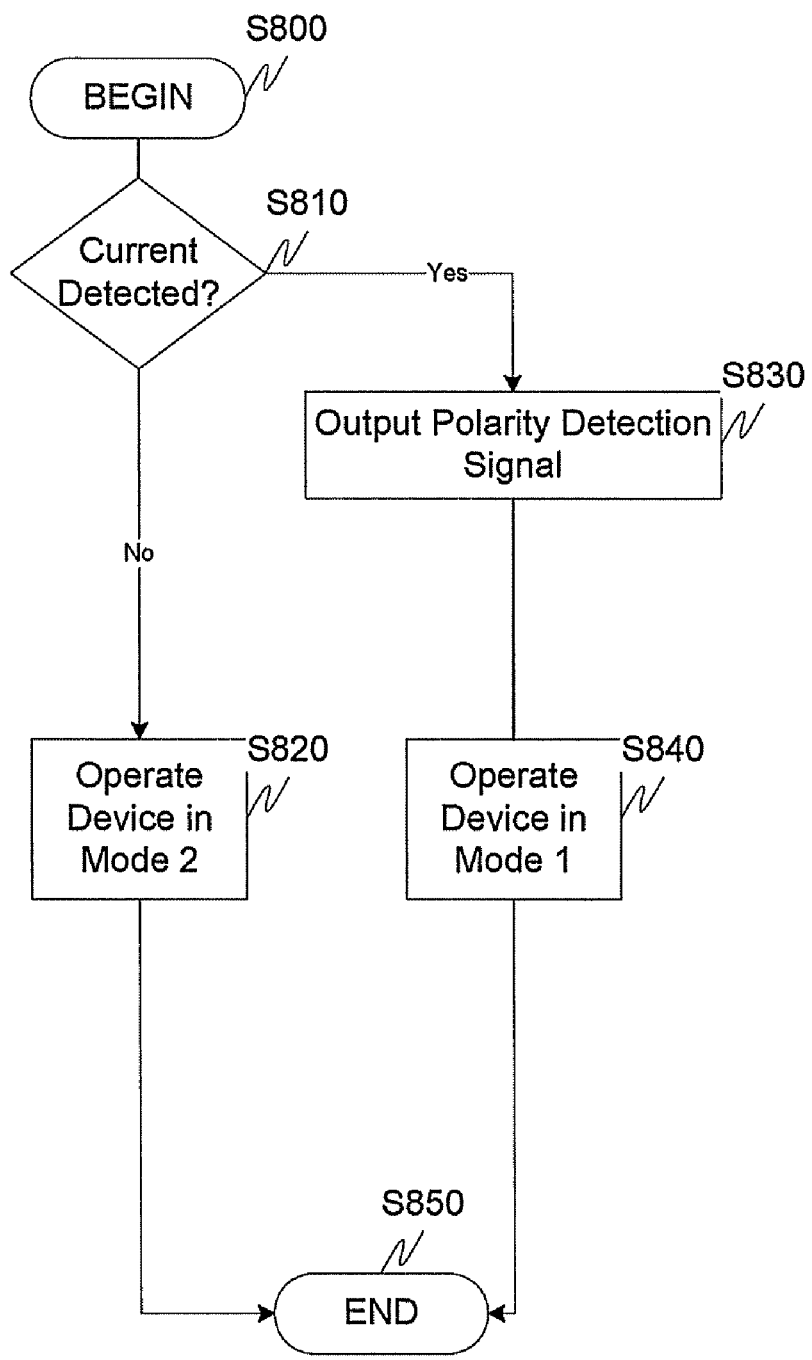
FIG. 8 is a flowchart illustrating another method for operating a battery orientation operational control circuit according to this invention.

FIG. 8 outlines another exemplary embodiment of controlling a battery orientation operational control circuit according to this invention. Control begins at S800 and continues to step S810. In step S810, a determination is made whether current is detected. If current is not detected, control continues to step S820 where the device operates in a second mode of operation with control continue to step S850 where the control sequence ends.

Alternatively, if current is detected, control continues to step S830 where a polarity detection signal is output. In step S840, this polarity detection signal is used to place the device in a first mode of operation with control continuing to step S850 where the control sequence ends.

The present invention, in various embodiments, includes components, methods, processes, systems and/or apparatus substantially as depicted and described herein, including various embodiments, subcombinations and subsets thereof. Those of skill in the art will understand how to make and use the present invention after understanding the present disclosure. The present invention, in various embodiments, includes providing devices and processes in the absence of items not depicted and/or described herein or in various embodiments hereof, including in the absence of such items as may have been used in previous devices or processes, e.g., for improving performance, achieving ease and\or reducing cost of implementation.

The foregoing discussion of the invention has been presented for purposes of illustration and description. The foregoing is not intended to limit the invention to the form or forms disclosed herein. In the foregoing description for example, various features of the invention are grouped together in one or more embodiments for the purpose of streamlining the disclosure. The features of the embodiments of the invention may be combined in alternate embodiments other than those discussed above. This method of disclosure is not to be interpreted as reflecting an intention that the claimed invention requires more features than are expressly recited in each claim. Rather, as the following claims reflect, inventive aspects lie in less than all features of a single foregoing disclosed embodiment. Thus, the following claims are hereby incorporated into this description, with each claim standing on its own as a separate exemplary embodiment of the invention.

Moreover, though the description of the invention has included description of one or more embodiments and certain variations and modifications, other variations, combinations, and modifications are within the scope of the invention, e.g., as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/ or equivalent structures, functions, ranges or steps are disclosed herein, and without intending to publicly dedicate any patentable subject matter.

The invention claimed is:

1. A device comprising:
   a diode;
   a current detector; and
   a rectifier,
   wherein:
   the current detector is connected in parallel with the rectifier and a battery and outputs a first polarity orientation control signal when the parallel-connected battery is in a first position,
   the current detector outputs a second polarity orientation control signal when the parallel-connected battery is in a second position, and
   the polarity orientation control signal controls a mode of operation of the device.

2. The device of claim 1, wherein the second polarity orientation control signal is the absence of a signal.

3. The device of claim 1, further comprising a second current detector.

4. The device of claim 1, further comprising a switch controlled by the polarity orientation control signals.

5. The device of claim 1, further comprising a low battery indicator module.

6. The device of claim 1, wherein the first polarity orientation control signal instructs the device to operate in a first mode of operation, and the second polarity orientation control signal instructs the device to operate in a second mode of operation.

7. The device of claim 1, further comprising one or more other electrical components, the other electrical components being one or more of a resistor, a capacitor, an inductor, an indicator, a diode and a battery.

8. The device of claim 1, wherein the device is a phone, and a first mode of operation when the battery is in the first position is "Press-to-Talk" and a second mode of operation when the battery is in the second position is "Press-to-Amplify."

9. The device of claim 1, wherein power supplied to a subset of the circuits in the device is the same polarity regardless of battery orientation.

10. A method for controlling a mode of operation of a device comprising:
    detecting a battery orientation;
    outputting, by a polarity detector, a polarity detection signal; and
    changing the mode of operation of the device based on the polarity detection signal, wherein a battery can be inserted in the device in either orientation without affecting power supplied to the device, and the polarity detector is connected in parallel with a rectifier and the battery.

11. The method of claim 10, wherein the polarity detection signal is a first polarity orientation control signal and is output when the battery is in a first position, or the polarity detection signal is a second polarity orientation control signal and is output when the battery is in a second position.

12. The method of claim 11, wherein the second polarity orientation control signal is the absence of a signal.

13. The method of claim 11, wherein the first polarity orientation control signal instructs the device to operate in a first mode of operation, and the second polarity orientation control signal instructs the device to operate in a second mode of operation.

14. The method of claim 10, wherein the device is a phone, and a first mode of operation, when the battery is in a first position, is "Press-to-Talk," and a second mode of operation, when the battery is in a second position, is "Press-to-Amplify."

15. The method of claim 10, further comprising utilizing the polarity detection signal to drive a switch, the switch controlling the mode of operation of the device.

16. The method of claim 10, further comprising activating a low battery indication module.

17. The method of claim 10, wherein the device is a handset.

18. The method of claim 10, wherein there are a plurality of current detectors capable of outputting a polarity detection signal.

19. The method of claim 10, wherein the device is a toy.

20. The method of claim 10, wherein the device contains X number of batteries, where X is greater than or equal to 2, thereby allowing $2^X$ different operational modes to be specified by varying the battery orientation.

* * * * *